US012763574B2

(12) United States Patent
Davidson

(10) Patent No.: US 12,763,574 B2
(45) Date of Patent: Oct. 13, 2026

(54) SYSTEM AND METHOD FOR MANAGING A FAULT IN A POWER TRANSMISSION NETWORK

(71) Applicant: GE Infrastructure Technology LLC, Greenville, SC (US)

(72) Inventor: Colin Davidson, Stafford (GB)

(73) Assignee: GE VERNOVA INFRASTRUCTURE TECHNOLOGY LLC, Greenville, SC (US)

( * ) Notice: Subject to any disclaimer, the term of this patent is extended or adjusted under 35 U.S.C. 154(b) by 113 days.

(21) Appl. No.: 19/041,293

(22) Filed: Jan. 30, 2025

(65) Prior Publication Data

US 2025/0253644 A1 Aug. 7, 2025

(30) Foreign Application Priority Data

Feb. 7, 2024 (EP) .................................... 24156438

(51) Int. Cl.
*H02H 7/26* (2006.01)
*G01R 31/08* (2020.01)

(52) U.S. Cl.
CPC ........... *H02H 7/268* (2013.01); *G01R 31/086* (2013.01)

(58) Field of Classification Search
CPC .... G01R 31/085; G01R 31/086; H02H 7/265; H02H 7/268; H02H 7/28; Y02E 60/60
USPC ............................................................ 361/64
See application file for complete search history.

(56) References Cited

U.S. PATENT DOCUMENTS

| | | | | |
|---|---|---|---|---|
| 11,070,045 | B1 * | 7/2021 | Li | H02H 3/00 |
| 2012/0026760 | A1 * | 2/2012 | Juhlin | H02J 3/36 363/35 |

FOREIGN PATENT DOCUMENTS

| | | | | | |
|---|---|---|---|---|---|
| CN | 106468752 | A | * | 3/2017 | G01R 31/088 |
| CN | 110277772 | A | * | 9/2019 | H02J 3/36 |
| CN | 116500378 | A | * | 7/2023 | G01R 31/088 |
| CN | 116632790 | A | * | 8/2023 | H02H 7/268 |

OTHER PUBLICATIONS

Machine translation of Liu et al. Chinese Patent Document CN 106468752 A Mar. 2017 (Year: 2017).*

(Continued)

*Primary Examiner* — Kevin J Comber
(74) *Attorney, Agent, or Firm* — Eversheds Sutherland (US) LLP

(57) ABSTRACT

A system and a method for managing a fault on a transmission line. The system includes an electrical branch, a diode arrangement and a controller. The electrical branch includes an inductor and a circuit breaker connected in series between a first terminal and a second terminal. The circuit breaker is configured to connect or disconnect the first terminal and the second terminal. The diode arrangement includes at least one diode, wherein a first end of the diode arrangement is connected to the electrical branch, and a second end of the diode arrangement is connected to a third terminal. The controller is configured to receive an indication signal, wherein the indication signal is indicative of a forward current in the diode arrangement. The controller is further configured to, in response to receiving the indication signal, issue a command to the circuit breaker to disconnect the first terminal and the second terminal.

15 Claims, 8 Drawing Sheets

(56) References Cited

OTHER PUBLICATIONS

Machine translation of Zhao et al. Chinese Patent Document CN 110277772 A Sep. 2019 (Year: 2019).*
Machine translation of Cheng et al. Chinese Patent Document CN 116500378 A Jul. 2023 (Year: 2023).*
Machine translation of Wu et al. Chinese Patent Document CN 116632790 A Aug. 2023 (Year: 2023).*
Makkieh et al. "Fault Location in DC Microgrids Based on a Multiple Capacitive Earthing Scheme" 2020 (Year: 2020).*
Extended European Search Report issued in EP Application No. 24156438.4 dated Aug. 26, 2024, 9 pages.
Makkieh et al.: Fault Location in DC Microgrids Based on a Multiple Capacitive Earthing Scheme, IEEE Journal of Emerging and Selected Topics in Power Electronics, vol. 9, No. 3, pp. 2550-2559, Jun. 2021.

* cited by examiner

SYSTEM AND METHOD FOR MANAGING A FAULT IN A POWER TRANSMISSION NETWORK

FIELD OF THE INVENTION

The present invention relates to a system and a method for managing a fault on a transmission line, and more particularly a system and a method for controlling a circuit breaker in a power transmission network.

BACKGROUND

In high voltage direct current (HVDC) power transmission networks alternating current (AC) power is typically converted to direct current (DC) power for transmission via a power transmission medium, for example overhead lines, under-sea cables, and/or underground cables. This conversion removes the need to compensate for the AC reactive/capacitive load effects imposed by the power transmission medium, i.e., the transmission line or cable, and reduces the cost per kilometre of the lines and/or cables, and thus becomes cost-effective when power needs to be transmitted over a long distance.

The conversion between DC power and AC power is utilised where it is necessary to interconnect DC and AC power, for example between an AC grid and a HVDC transmission line. In power transmission networks, power conversion means, also known as converter stations (i.e., power converters in converter stations, power inverters etc.) are required at each interface or interconnection between AC and DC power to implement the required conversion from AC to DC or from DC to AC.

A HVDC transmission network typically includes a HVDC transmission line (i.e., the power transmission medium) with a converter station connected on either side of the HVDC transmission line. The converter stations are typically connected to AC networks via switchgears. A typical HVDC transmission network will thus have two converter stations, one on either side of the HVDC transmission line, interfacing the HVDC transmission line to a respective AC network or to the same AC network.

SUMMARY OF THE INVENTION

A fault may occur in the HVDC transmission line. A fault current in a DC transmission line tends to continue to rise over time. In conventional HVDC systems, AC circuit breakers between converter stations and respective AC networks are opened to manage faults in the HVDC transmission line. The present inventors have realised that, in such systems, response to faults tends to be slow. The present inventors have further realised that DC circuit breakers between the converter stations and the DC transmission line can be used to isolate the fault more quickly.

Furthermore, in a multi-terminal DC system, conventional methods tend to require end-to-end communication in order to make the decision of which circuit-breaker(s) to open (commonly known as "discrimination"). Such end-to-end communication tends to be slow, and thus conventional methods for fault management tend to be unsuitable for detecting and discriminating a fault on a transmission line in a multi-terminal DC system.

In light of these considerations and emerging grid requirements, it is desirable to develop methods that provide improved fault management of a fault in a multi-terminal DC system.

According to a first aspect, there is provided a system for managing a fault on a HVDC transmission line. The system comprises an electrical branch, a diode arrangement, and a controller. The electrical branch comprises an inductor and a circuit breaker connected in series between a first terminal and a second terminal. The circuit breaker is configured to connect or disconnect the first terminal and the second terminal. The diode arrangement comprises at least one diode, wherein a first end of the diode arrangement is connected to the electrical branch, and a second end of the diode arrangement is connected to a third terminal. The controller is configured to receive an indication signal, wherein the indication signal is indicative of a forward current in the diode arrangement. The controller is further configured to, in response to receiving the indication signal, issue a command to the circuit breaker to disconnect the first terminal and the second terminal.

In a HVDC system, a fault should be detected and isolated as soon as possible, otherwise the fault current will continue to rise, resulting in a greater demand on the circuit breakers. As such, it is desirable to manage the fault without transmitting information from one side of the HVDC transmission line to the other. Furthermore, in a multi-terminal DC system, wherein a power converter station may be connected to a plurality of transmission lines, it is desirable to not only detect the fault, but also to determine which of the transmission lines contains the fault, such that only the appropriate circuit breaker(s) is(are) opened (triggered) in order to isolate the fault. Determining which line contains the fault may be referred to as selectivity or discrimination. A fault management system that cannot discriminate may cause an otherwise healthy transmission line to become inadvertently or accidently disconnected due to opening of the wrong circuit breaker. Thus, the discrimination capability of the fault management system should be highly reliable.

The present inventors have realised that by connecting the diode arrangement to the end of a transmission line, the forward conduction of the diode arrangement can be used as a means to both detect a fault on a transmission line, and determine (i.e., discriminate) which transmission line contains the fault.

A circuit breaker can be triggered as a result of detecting the forward current. This advantageously tends to allow for a determination to be made that a fault has occurred on a specific transmission line, without requiring information to be transmitted from one side of the transmission line to the other. In other words, it tends to be possible to determine that a fault has occurred, and which transmission line the fault is on, based on one side of the transmission line only. This tends to improve the speed at which the determination of which circuit breaker to open can be made, and thus allows for the fault to be isolated much faster compared to the conventional methods discussed above.

Additionally, because only the diode connected to the faulty transmission line will conduct, the likelihood of triggering the wrong circuit breaker tends to be greatly reduced, or is zero. Thus, the determination of which circuit breaker to open (i.e., the selectivity or discrimination capabilities) tends to be highly reliable, compared to other conventional methods.

The third terminal may be connected to ground.

The third terminal may be connected a neutral line.

The third terminal may be connected a negative line.

The system may further comprise a second electrical branch comprising a second inductor and a second circuit breaker connected in series between a fourth terminal and a fifth terminal. The second circuit breaker may be configured to connect or disconnect the fourth terminal and the fifth terminal. The third terminal may be connected to the second electrical branch. The controller may be further configured to, in response to receiving the indication signal, issue the command to the second circuit breaker to disconnect the third terminal and the fourth terminal.

The diode arrangement may be orientated such that the diode arrangement is reverse biased and current blocking when there is a positive voltage on the electrical branch.

The diode arrangement may be orientated such that the diode arrangement is reverse biased and current blocking when there is a negative voltage on the electrical branch.

The system may further comprise a measurement device connected to the diode arrangement and the controller. The measurement device may be configured to measure the forward current through the diode arrangement; determine the indication signal based on the forward current; and output the indication signal.

The measurement device may comprise a Current Transformer or Rogowski coil to measure the forward current.

The indication signal may be a signal based on, or a time-derivative of, the forward current through the diode arrangement.

The indication signal may be a signal proportional to the forward current.

The indication signal may be a signal determined by comparing the forward current to a threshold value.

The indication signal may be an analogue signal.

The indication signal may be a digital signal.

The controller may be configured to issue the command in less than 150 microseconds from receiving the indication signal.

In the electrical branch, the inductor may be connected in series between the first terminal and the circuit breaker, the circuit breaker may be connected in series between the inductor and the first end of the diode arrangement, and the first end of the diode arrangement may be connected in series between the circuit breaker and the second terminal.

In the electrical branch, the inductor may be connected in series between the first terminal and the first end of the diode arrangement, the first end of the diode arrangement may be connected in series between the inductor and the circuit breaker, and the circuit breaker may be connected in series between the first end of the diode arrangement and the second terminal.

In the electrical branch, the circuit breaker may be connected in series between the first terminal and the inductor, the inductor may be connected in series between the circuit breaker and the first end of the diode arrangement, and the first end of the diode arrangement may be connected in series between the inductor and the second terminal.

The diode arrangement may comprise a plurality of diodes connected in series.

The diode arrangement may be configured to operate at a voltage of at least 100 kV.

The controller may be further configured to, in response to receiving the indication signal, issue a second command to a further circuit breaker outside of the system.

The second command may configure the further circuit breaker from a regular state into an armed state, wherein in the armed state the further circuit breaker is configured to open faster compared to the regular state.

The second command may control the further circuit breaker to open.

In a second aspect there is provided a HVDC system comprising a converter station; a HVDC transmission line; and the system of any preceding aspect. A first end of the HVDC transmission line is connected to the second terminal; and the converter station is connected to the first terminal.

The HVDC transmission line may have a length of at least 100 km.

The HVDC transmission line may be configured to operate at a voltage of at least 300 kV.

In a third aspect, there is provided a multi-terminal HVDC transmission network, comprising a first converter station; a second converter station; a third converter station; a first HVDC transmission line; and a second HVDC transmission line. The first converter station is connected to a first end of the first HVDC transmission line by a first sub-system; the second converter station is connected to a second end of the first HVDC transmission line by a second sub-system; the first converter station is connected to a first end of the second HVDC transmission line by a third sub-system; the third converter station is connected to a second end of the second HVDC transmission line by a fourth sub-system; and the first, second, third and fourth sub-systems each comprise the system of any preceding aspect.

In a fourth aspect there is provided a method for managing a fault on a HVDC transmission line by using a system, the system comprising an electrical branch and a diode arrangement, wherein the electrical branch comprises an inductor and a circuit breaker connected in series between a first terminal and a second terminal, wherein the circuit breaker is configured to connect or disconnect the first terminal and the second terminal, and wherein the diode arrangement comprises at least one diode, wherein a first end of the diode arrangement is connected to the electrical branch, and a second end of the diode arrangement is connected to a third terminal. The method comprises receiving, by a controller, an indication signal, wherein the indication signal is indicative of a forward current in the diode arrangement; and in response to receiving the indication signal, issuing, by the controller, a command to the circuit breaker to disconnect the first terminal and the second terminal.

Generally, the controller disclosed herein tends to be configured to execute the methods described herein.

According to a fifth aspect, there is provided a computer program comprising instructions which when executed by a processor of a controller, cause the controller to perform the method of the fourth aspect.

According to a sixth aspect, there is provided a non-transitory computer-readable storage medium comprising the computer program of the fifth aspect.

It will be appreciated that particular features of different aspects of the invention share the technical effects and benefits of corresponding features of other aspects of the invention. More specifically, the technical effects and benefits of the system, the HVDC system, the multi-terminal HVDC transmission network, the computer program, and the non-transitory computer-readable medium, are shared by the method of the invention.

It will also be appreciated that the use of the terms "first" and "second", and the like, are merely intended to help distinguish between similar features and are not intended to indicate a relative importance of one feature over another, unless otherwise specified.

Within the scope of this application, it is expressly intended that the various aspects, embodiments, examples and alternatives set out in the preceding paragraphs, and the claims and/or the following description and drawings, and in particular the individual features thereof, may be taken independently or in any combination. That is, all embodiments and all features of any embodiment can be combined in any way and/or combination, unless such features are incompatible.

DETAILED DESCRIPTION

Figure 1:
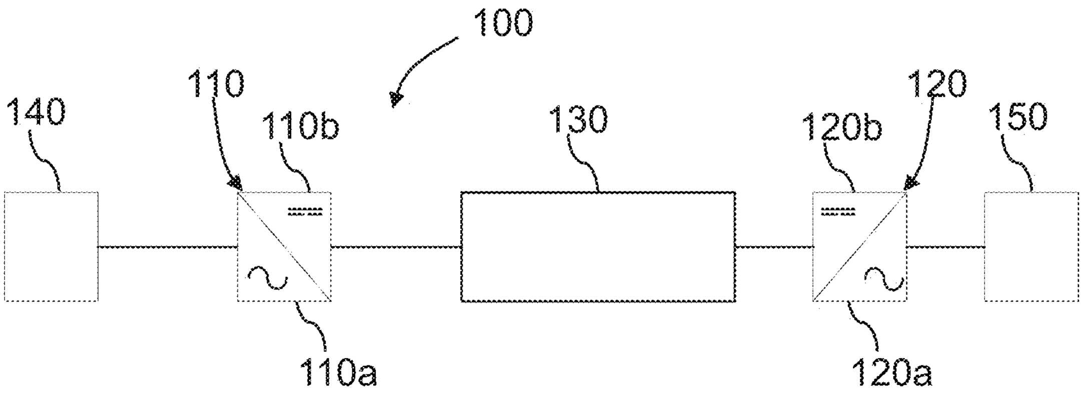
FIG. 1 is a schematic illustration of an example of a DC power transmission network.

FIG. 1 illustrates generically, an example of a power transmission network 100. The illustration is not intended to be limited to representing a particular power transmission scheme, such as a monopole or bipole High Voltage Direct Current (HVDC) transmission network, but is moreover provided as a generic example illustrating principles of operation of a power transmission network that are useful for understanding the invention. In this manner, the power transmission network 100 may represent, generically, a monopole or bipole scheme, or may represent a multiterminal power transmission scheme, for instance. Hence whilst specific features in the illustration are shown connected to each other with a specific number of connections, it will be understood that this is not intended to be limiting either, but moreover to illustrate a generic connection between features/components. Related, is that relative dimensions or distances between components perceived in the illustration are also not intended to be limiting. It will therefore be understood that principles and features in the power transmission network 100 and herein discussed can be applied to networks comprising the controller 200 of FIG. 2, for instance.

The power transmission network 100 includes a first power converter 110 (also known as a converter, inverter, inverter station, etc.), a second power converter 120, a transmission medium 130, a first AC network 140, and a second AC network 150.

The power converters 110, 120, are configured to convert AC power to DC power, acting essentially as rectifiers; or DC power to AC power, acting essentially as inverters. The power converters 110, 120 may each comprise a single converter in the case of a monopole system, or two converters in the case of a bipole system. The power converters 110, 120 may represent a plurality of converter stations arranged as a multi-terminal power transmission system. Generically, the first power converter 110 comprises a first AC side 110*a* and a first DC side 110*b*. Generically, the second power converter 120 comprises a second AC side 120*a* and a second DC side 120*b*.

The first power converter 110 is connected to a first AC network 140. The first AC network 140 is connected to the first AC side 110*a* of the first power converter 110. The second power converter 120 is connected to a second AC network 150. The second AC network 150 is connected to the second AC side 120*a* of the second power converter 120.

The first AC network 140 and/or second AC network 150 may be electrical power transmission systems comprising power generation apparatus, transmission apparatus, distribution apparatus, and electrical loads. The first AC network 140 and/or second AC network 150 may comprise a renewable power generation network such as a wind-power generation network, solar-power generation network, bio-power generation network. The first AC network 140 or second AC network 150 may be a consumer network, or a network containing a mix of consumers and generators. By way of non-limiting example, the first AC network 140 may be a power generation network, with second AC network 150 being a network containing a mix of consumers and generators, for instance. In particular examples, the power converters 110, 120 may be geographically remote. For instance, the first power converter 110 may reside on an off-shore platform connected to a wind farm, and the second power converter 120 may reside on-shore.

The power transmission medium 130 connects the first power converter 110 and the second power converter 120. The power transmission medium 130 is connected between the first DC side 110*b* of the first power converter 110 and the second DC side 120*b* of the second power converter 120. The power transmission medium 130 may comprise electrical cables and other electrical components for connecting the first and second power converters 110, 120. For instance, the power transmission medium 130 may comprise a conductor providing a first electrical pole; and/or a conductor providing a second electrical pole. A neutral arrangement may also be provided interconnecting the first and second power converters 110, 120. The power transmission medium 130 provides the medium through which DC power is transferred between the power converters 110, 120.

The operation of the power transmission network 100 can be generically described as follows. The first AC network 140 generates AC power that is provided to the first power converter 110 at the first AC side 110*a*. The first power converter 110 converts the received AC power to DC power for transmission to the transmission medium 130. The DC power is transmitted from the first DC side 110*b* of the first power converter 110 to the transmission medium 130. The second DC side 120*b* of the second power converter 120 receives DC power from the transmission medium 130. The second power converter 120 converts the received DC power to AC power. The AC power is then provided from the second AC side 120*a* of the second power converter 120 to the second AC network 150 for consumption, for instance.

As the second power converter 120 receives power from the transmission medium 130, the first power converter 110 transfers power from the AC network 140 to the transmission medium 130, such that the nominal voltage of the transmission medium 130 is maintained.

Additionally, in some circumstances, the first power converter 110 can also receive power from the transmission medium 130. The first power converter 110 can thus be configured to transfer real or reactive power in either direction, into or out of the first AC network 140. The second power converter 120 can also be configured to transfer real or reactive power in either direction, into or out of the second AC network 150.

It will be appreciated that various other electrical components may be located at any particular location or with any particular feature/component in the example power transmission network 100. These may include switches, transformers, resistors, reactors, surge arrestors, harmonic filters and other components well known in the art.

It will be appreciated that converters or power conversion means may comprise a number of different technologies such as voltage sourced converters (for instance using insulated gate bipolar transistor (IGBT) valves). Such converters may generally be considered to use 'power electronics'. Power electronic converters may comprise multi-level voltage sourced converters, for instance.

It will be appreciated that cables used as power transmission mediums may comprise the following non-limiting examples of crosslinked polyethylene (XLPE) and/or mass impregnated (MI) insulation cables. Such cables may comprise a conductor (such as copper or Aluminium) surrounded by a layer of insulation. Dimensions of cables and their associated layers may be varied according to the specific application (and in particular, operational voltage requirements). Cables may further comprise strengthening or 'armouring' in applications such as subsea installation. Cables may further comprise sheaths/screens that are earthed at one or more locations.

Moreover, it will be understood that the power transmission network 100 may be used with three-phase power systems. In a three-phase power system, three conductors supply respective first, second and third phases of AC power to a consumer. Each of the first, second and third phases will typically have equal magnitude voltages or currents, which are displaced in phase from each other by 120°.

In a three-phase power system, phase currents and voltages can be represented by three single phase components: a positive sequence component; a negative sequence component; and a zero-sequence component. It is the positive sequence component that rotates in phase in accordance with the power system. Hence, in a preferred scenario, only positive sequence voltage/current will exist. It will be understood that an unbalance in voltage or current between the first, second and third-phases, of a three-phase system, in magnitude or phase angle, can give rise to undesirable negative or zero-sequence components. Such an unbalance can be caused by fault conditions, for instance in the first and second AC networks 140, 150.

The power transmission network 100 may be operated using methods such as synchronous grid forming (SGFM) wherein either or both of the power converters 110, 120 behave as three-phase, positive-phase sequence AC voltage sources behind an impedance, that operate at a frequency synchronous with other SGFM sources connected to the power transmission network 100.

The power transmission network 100 may further comprise a controller for controlling the operation of components of the power transmission network 100. For instance, a controller may be provided for executing the methods described herein. Such a controller may control components related to one or both of the first and second power converters 110, 120, for instance. Such a controller may be referred to as a controller means or control means. The controller may be the controller 200 of FIG. 2.

Figure 2:
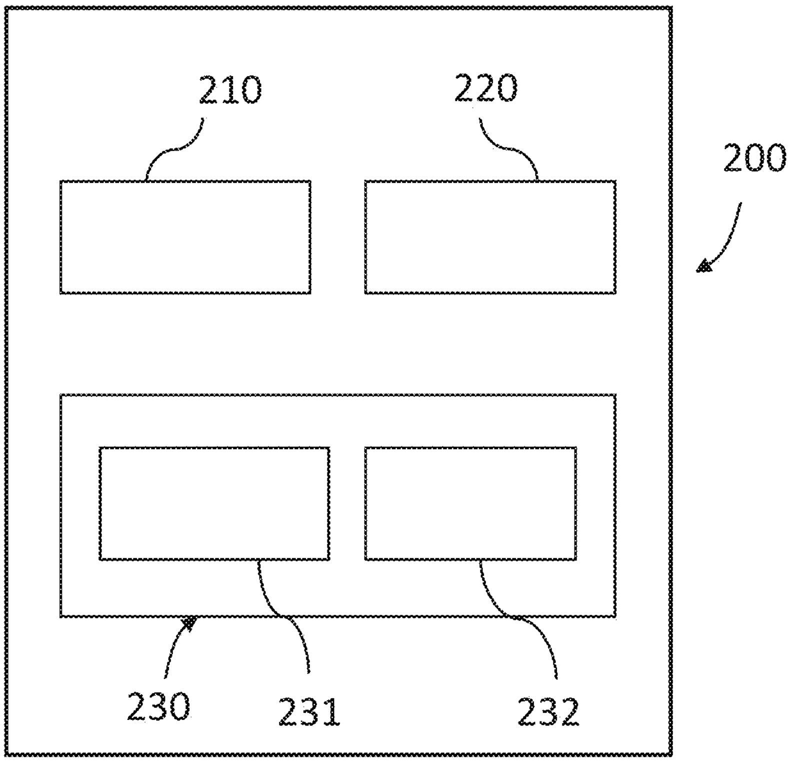
FIG. 2 is a schematic illustration of a controller for controlling a circuit breaker and/or a power transmission network.

FIG. 2 illustrates an embodiment of a controller 200 as may be used in implementing the methods described herein.

The controller 200 comprises a memory 210 and at least one processor 220. The memory 210 comprises computer-readable instructions, which when executed by the at least one processor 220, cause the controller 200 to perform the method/s described herein.

The controller 200 comprises a transceiver arrangement 230 which may comprise a separate transmitter 231 and receiver 232. The transceiver arrangement 230 may be used to operatively communicate with other components or features of embodiments described herein either directly or via a further interface such as a network interface. The transceiver arrangement 230 may for instance send and receive control signals using the transmitter 231 and the receiver 232. The control signals may contain or define electrical control parameters such as reference currents or reference voltages.

The at least one processor 220 is configured to execute computer-readable instructions and/or performing logical operations. The at least one processor 220 may be a microcontroller, microprocessor, central processing unit (CPU), field programmable gate array (FPGA) or similar programmable controller. The controller may further comprise a user input device and/or output device. The processor 220 is communicatively coupled to the memory 210 and may be coupled to the transceiver 230.

The memory 210 may be a computer readable storage medium. For instance, the memory 210 may include a non-volatile computer storage medium. For example, the memory 210 may include a hard disk drive, flash memory, etc.

Whilst not shown in FIG. 2, the controller 200 may additionally include a user input device interface and/or a user output device interface, which may allow for visual, audible or haptic inputs/outputs. Examples of user input devices include, but are not limited to, interfaces to electronic displays, touchscreens, keyboards, mice, speakers, and microphones.

Figure 3:
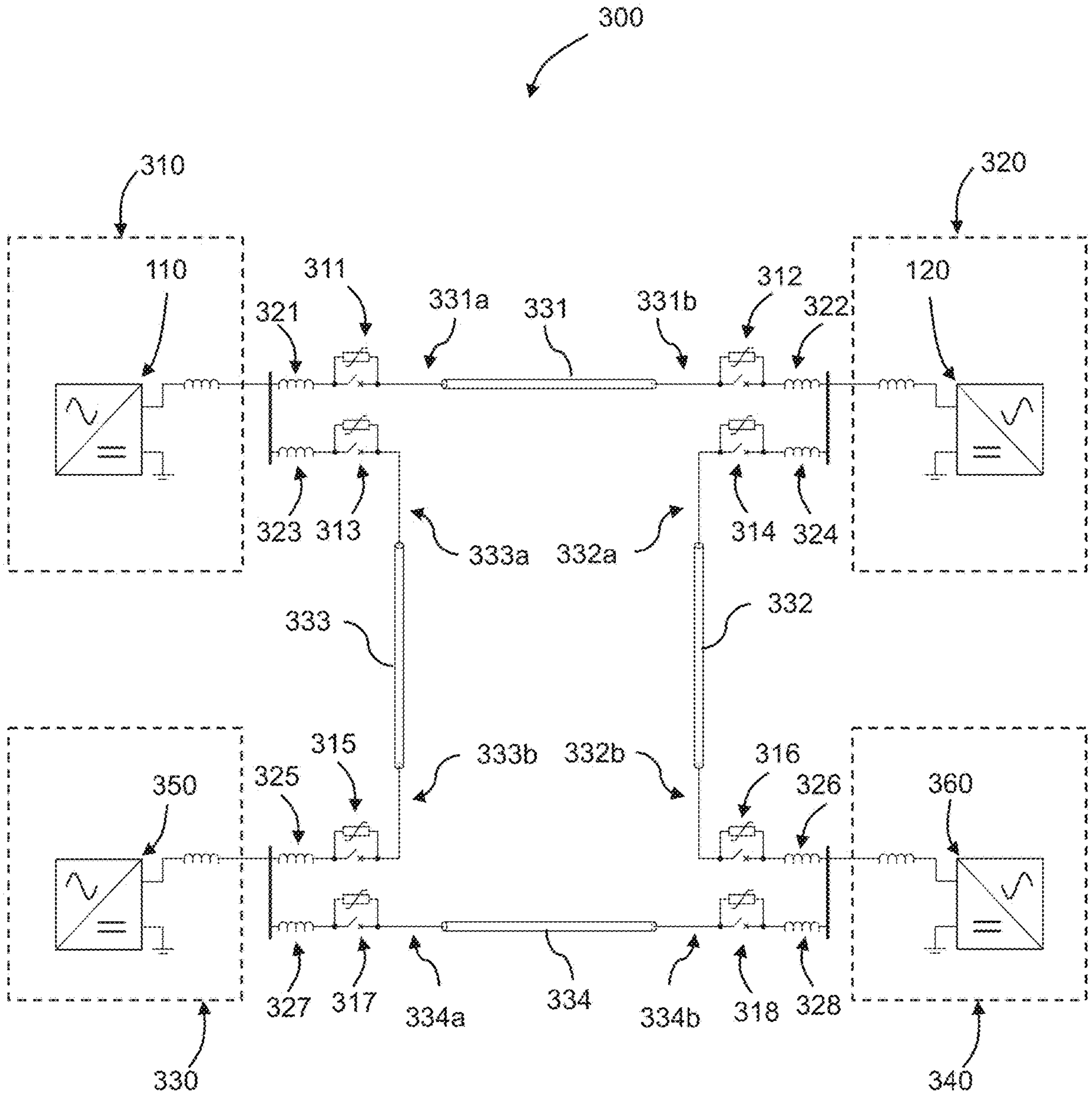
FIG. 3 is a schematic illustration of an example of a multi-terminal DC power transmission network.

FIG. 3 illustrates an example of a multi-terminal power transmission network 300. The multi-terminal power transmission network may be a High Voltage Direct Current (HVDC) transmission network 300.

The multi-terminal HVDC transmission network 300 comprises a first converter station 310, a second converter station 320, a third converter station 330, and a fourth converter station 340. Each converter station 310, 320, 330, 340 comprises a power converter having an AC side and a DC side, as discussed above. In particular, the first converter station 310 comprises the first power converter 110, and the second converter station 320 comprises the second power converter 120. The third converter station 330 comprises a third power converter 350. The fourth converter station 340 comprises a fourth power converter 360.

The multi-terminal HVDC transmission network 300 further comprises a first transmission line 331, a second transmission line 332, a third transmission line 333, and a fourth transmission line 334. Each of the transmission lines 331, 332, 333, 334 are a power transmission medium 130 as described above. Each transmission line 331, 332, 333, 334 has a first end 331*a*, 332*a*, 333*a*, 334*a* and a second end 331*b*, 332*b*, 333*b*, 334*b*.

A circuit breaker and an inductor are connected to each end (or end portion) of each transmission line 331, 332, 333, 334. In particular, a first circuit breaker 311 and first inductor 321 are connected to the first end 331*a* of the first transmission line 331. A second circuit breaker 312 and second inductor 322 are connected to the second end 331*b* of the first transmission line 331. A third circuit breaker 313 and third inductor 323 are connected to the first end 333*a* of the third transmission line 333. A fourth circuit breaker 314 and fourth inductor 324 are connected to the first end 332*a* of the second transmission line 332. A fifth circuit breaker 315 and fifth inductor 325 are connected to the second end 333*b* of the third transmission line 333. A sixth circuit breaker 316 and sixth inductor 326 are connected to the second end 332*b* of the second transmission line 332. A seventh circuit breaker 317 and seventh inductor 327 are connected to the first end 334*a* of the fourth transmission line 334. An eighth circuit breaker 318 and eighth inductor 328 are connected to the second end 334*b* of the fourth transmission line 334.

The first converter station 310 is connected to the second converter station 320 via a series connection of the first inductor 321, the first circuit breaker 311, the first transmission line 331, the second circuit breaker 312, and the second inductor 322. The first converter station 310 is also connected to the third converter station 330 via a series connection of the third inductor 323, the third circuit breaker 313, the third transmission line 333, the fifth circuit breaker 315, and the fifth inductor 325. The second converter station 320 is connected to the fourth converter station 340 via a series connection of the fourth inductor 324, the fourth circuit breaker 314, the second transmission line 332, the sixth circuit breaker 316, and the sixth inductor 326. The third converter station 330 is connected to the fourth converter station 340 via a series connection of the seventh inductor 327, the seventh circuit breaker 317, the fourth transmission line 334, the eighth circuit breaker 318, and the eighth inductor 328. Each converter station 310, 320, 330, 340 is thus connected to two other converter stations. In this manner, the converter stations 310, 320, 330, 340 and transmission lines 331, 332, 333, 334 form a multi-terminal HVDC transmission network 300.

FIG. 3 is an example of a mesh multi-terminal HVDC transmission network. However, the multi-terminal HVDC transmission network 300 may be a radial multi-terminal HVDC transmission network, if one of the transmission lines 331, 332, 333, 334 was removed. The multi-terminal HVDC transmission network 300 may have 3, 4, 5, or more than 5 converter stations.

In general, the operation of the multi-terminal HVDC transmission network 300 is similar to the power transmission network 100 discussed above, except that each power converter 110, 120, 350, 360 in each converter station 310, 320, 330, 340 is configured to supply two transmission lines 331, 332, 333, 334, rather than one. However, also as discussed above, this disclosure should not be limited to converter stations or power converters that supply two transmission lines. In particular, each power converter 110, 120, 350, 360 or converter station 310, 320, 330, 340 could be configured to supply 3, 4, 5 or more than 5 transmission lines.

The disclosure of FIG. 3 could equally apply to a positive pole or a negative pole of a bipolar system. Similarly, the disclosure of FIG. 3 can be adapted to a symmetrical monopole system by removing the ground connections and having a pair of DC lines or cables at equal and opposite voltage.

As discussed above, a fault in a DC system will tend to cause a fault current that rapidly rises with time, unlike a fault current in an AC system which has frequent periods of near zero current. A conventional method to manage the fault in an AC system is to isolate the fault by opening circuit breakers on both sides of the faulty transmission line. In order to isolate the fault, information related to a voltage and current on either side of the transmission line is transmitted from one side of the transmission line to the other. By comparing voltage and current information from both sides of the transmission line, it can be determined whether a fault has occurred in the respective line. After it has been determined that a fault has occurred in the respective line, the circuit breakers on either side of the faulty transmission line can be opened.

For a long transmission line, for example greater than or equal to 300 km, transmitting information from one side of the line to the other can be time consuming (for example, several milliseconds). For a DC system, this can be problematic, because in the several milliseconds that it can take to transmit the information, the magnitude of the fault current will tend to rise. When the circuit breakers eventually receive the command to open, they may be required to interrupt a relatively large fault current. As such, conventional methods for fault management in AC systems, for example fault detection and discrimination, tend not to be suitable for fault management in multi-terminal DC systems.

It can thus be understood that, in general, for a multi-terminal DC system, the faster a fault can be detected and the faulty line determined, the faster the circuit breakers can be opened, and the lower the fault current the circuit breakers will have to interrupt. Interrupting a lower fault current has numerous advantages compared to interrupting a higher fault current, for example the voltage and current requirements for the circuit breaker tends to be lower. The lower the voltage and current rating of a circuit breaker is, the smaller and less costly the circuit breaker tends to be. Such advantages are realised when using the systems and methods of this disclosure, as will now be discussed.

Additionally, in a multi-terminal transmission system, there tends to be an additional need to ensure that only the circuit breakers connected to the faulty transmission line open, and that a circuit breaker connected to an otherwise healthy transmission line is not accidentally opened (i.e., the fault management system should be able to discriminate between a faulty transmission line and a normal, non-faulty transmission line).

These and other problems tend to be solved when using the systems and methods of this disclosure, as will now be discussed.

Figure 4:
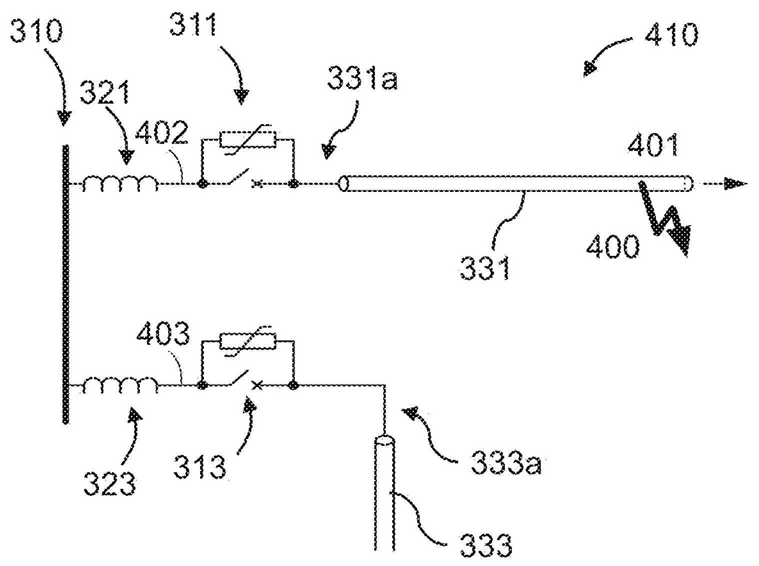
FIG. 4 is a schematic illustration of a part of a multi-terminal DC power transmission network.

FIG. 4 shows a part 410 of the conventional multi-terminal power transmission network 300 shown in FIG. 3 and described above. A fault 400 may occur in any part of any one of the transmission lines 331, 332, 333, 334. In this example, as shown in FIG. 4, a fault 400 has occurred at a first point 401 on the first transmission line 331. The first transmission line 331 may be referred to as a faulty transmission line 331. A second point 402 is located between the first circuit breaker 311 and the first converter station 310. The first inductor 321 is also located between the second point 402 and the first converter station 310. A third point 403 is located between the third circuit breaker 313 and the first converter station 310. The third inductor 323 is also located between the third point 403 and the first converter station 310.

Figure 5:
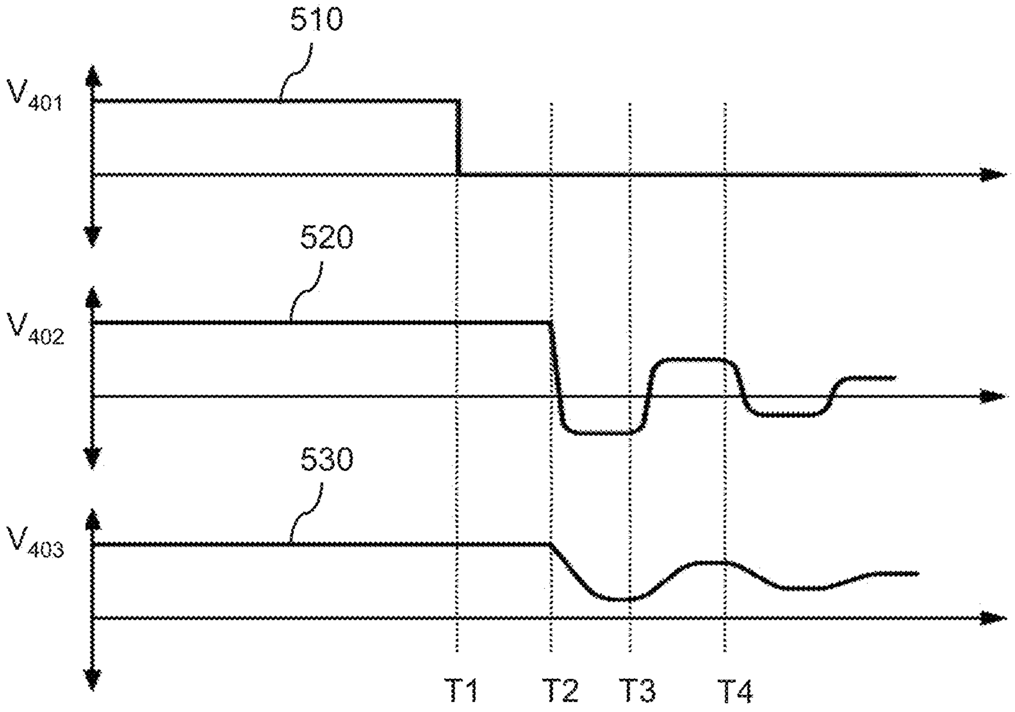
FIG. 5 is a graph showing voltage plotted against time, at various points in a conventional multi-terminal DC power transmission network before and after a fault.

FIG. 5 is a graph showing the voltage at the first, second and third points 401, 402, 403 in the part 410 before and after the fault 400, plotted against time. A first waveform 510 shows the voltage at the first point 401. A second waveform 520 shows the voltage at the second point 402. A third waveform 530 shows the voltage at the third point 403.

As can be seen in FIG. 5, before a time T1, the voltage at the first, second and third points 401, 402, 403 is 1 per unit (pu). This is indicative of a normal operation of the part 410.

At the time T1, the fault 400 occurs at the first point 401 on the first transmission line 331. As a result, the voltage at the first point 401 changes from 1 pu to or near 0 pu, as shown in the first waveform 510. Due to the length of the first transmission line 331, the voltage at the second point 402 and the third point 403 does not change at the time T1.

Between the time T1 and T2, the voltage change at the first point 401 propagates through the first transmission line 331 as a traveling wave. At time T2, a wavefront of the travelling wave arrives at the first converter station 310. As a result of the travelling wave arriving at the first converter station 310, after the time T2, the voltage at the second point 402 starts to fall, as shown in the second waveform 520. Also, there is also a slight fall in the voltage at the third point 403, although the third point 403 is not directly connected to the faulty transmission line 331. The fall in the voltage at the third point 403 (from time T2) is a result of an indirect connection the third point 403 has to the faulty transmission line 331, via the first converter station 310. Thus, the voltage changes at the second and third points 402, 403 as a result of the travelling wave.

Between the time T2 and T3, there is a period in which the voltage at the second point 402 becomes negative. This is due the travelling wave being reflected after it arrives at the converter station 310. The reflection causes the voltage at the second point 402 to temporarily stabilise at a magnitude that has a theoretical limit of −1 pu, but in practice the voltage may stabilise at less than that, for example −0.5 pu or smaller. Point 403 also stabilises at a voltage that is closer to the normal operating voltage than the voltage at which point 402 stabilises. In other words, point 403 sees an attenuated form of the transient compared with point 402.

At time T3 the voltage at the second and third points 402, 403 begins to rise. This is because a second wavefront has arrived at the first converter station 310 as a result of the travelling wave being reflected from an impedance discontinuity at the converter station, and back towards the fault where it will be reflected again. After time T3 the voltage at the second and third points 402, 403 continues to rise. The voltage at the second point 402 temporarily stabilises.

At time T4 the voltage at the second and third points 402, 403 begins to fall again. This is because a third wavefront has arrived at the first converter station 310 as a result of the travelling wave. After the time T4 the voltage at the second and third points 402, 403 continues to fall. The voltage at the second point 402 temporarily stabilises.

In this manner, the voltage at the second and third points 402, 403 oscillates as a result of the travelling wave caused by fault 400. Notably, the voltage at the third point 403 oscillates less than the voltage at the second point 402. Eventually, the oscillations will reduce in magnitude and the voltage at the second and third points 402, 403 will stabilise. However, from the time T1, a fault current in the faulty transmission line 331 has been rising, and as discussed above this is problematic for the circuit breakers on either side of the faulty transmission line 331. Also as discussed above, the voltage changes at the second and third points 402, 403 may make it difficult to distinguish, in the part 410, which of the transmission lines is faulty.

Figure 6:
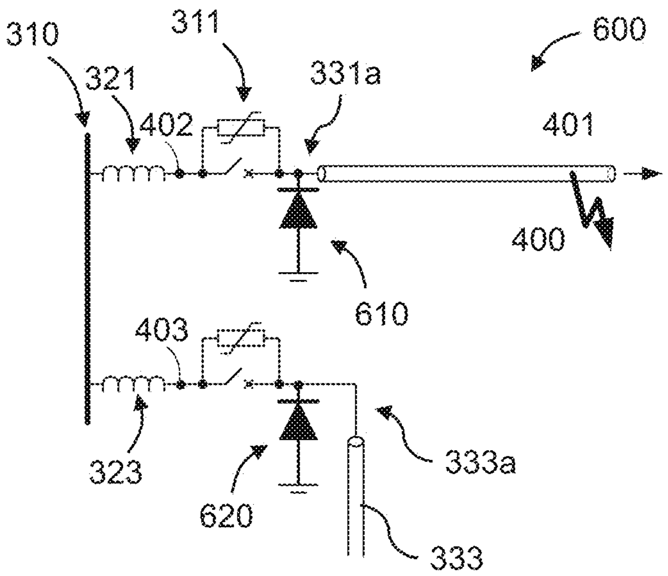
FIG. 6 is a schematic illustration of an improved part of a multi-terminal DC power transmission network.

FIG. 6 shows an improved part 600 of the multi-terminal power transmission network 300 shown in FIG. 3 and described above. The improved part 600 shown in FIG. 6 is similar to the part 410 shown in FIG. 4, except that a diode is connected to a first end of each transmission line. In particular, a first diode 610 is connected to a first end (or an end portion) 331*a* of the first transmission line 331. A second diode 620 is connected to a first end (or an end portion) 333*a* of the third transmission line 333. A first end of the first diode 610 is connected to the first end 331*a* of the first transmission line 331, and a second end of the first diode 610 is connected to ground. A first end of the second diode 620 is connected to the first end 333*a* of the third transmission line 333, and a second end of the second diode 620 is connected to ground. The first diode 610 is orientated such that the first diode 610 is reverse biased and current blocking when there is a positive voltage on the first transmission line 331. The second diode 620 is orientated such that the second diode 620 is reverse biased and current blocking when there is a positive voltage on the third transmission line 333.

The arrangement of the first and second diodes 610, 620 in the improved part 600 tends to be particularly suited for a bipole HVDC transmission scheme. However, the disclosure should not be limited thereto.

Specifically, the second ends of the first and second diodes 610, 620 could be connected to a neutral line, for example in the case of a monopole scheme, or a bipole scheme with a Dedicated Metallic Return.

Alternatively, the orientation of the first and second diodes 610, 620 may be reversed such that the first and second diodes 610, 620 are reverse biased and current blocking when there is a negative voltage on the first and second transmission lines 331, 333 respectively, for example in the case of a negative pole. It may thus be appropriate to refer to the transmission line voltage, whether it be a positive voltage or a negative voltage, as a normal operating voltage.

Additionally, in some schemes the first and second diodes 610, 620 may be connected between positive and negative lines, for example in the case of a symmetrical monopole scheme that does not include a neutral or ground connection.

Figure 7:
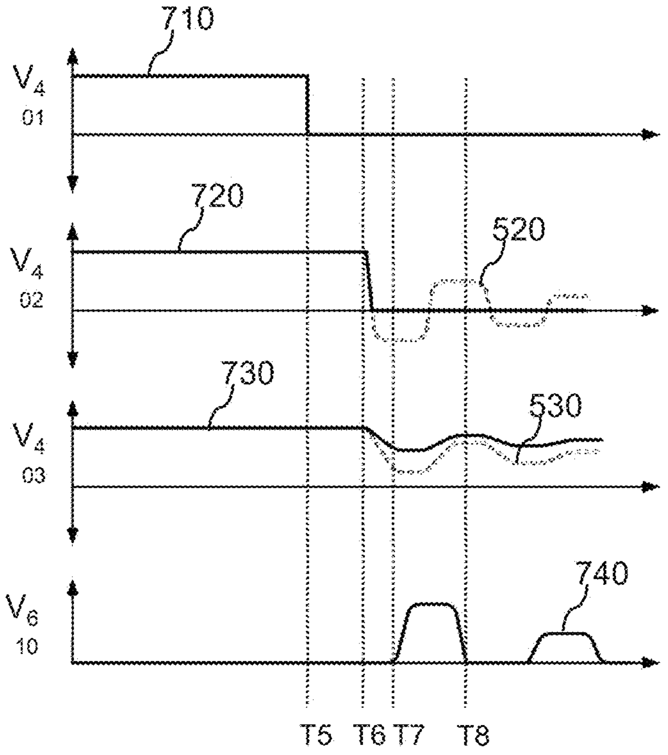
FIG. 7 is a graph showing voltage and current plotted against time, at various points in an improved multi-terminal DC power transmission network before and after a fault.

As a result of the first diode 610, the voltage at the second point 402 does not oscillate as a result of the travelling wave generated by the fault 400, as discussed below. This is shown in FIG. 7 which shows the voltage at the first, second and third points 401, 402, 403, as well as the current through the first diode 610, plotted against time before and after a fault. The first diode 610 clamps the voltage at point 402 to zero, which means that the voltage at point 403 must therefore be higher than zero and the second diode 620 cannot conduct.

In FIG. 7, a fourth waveform 710 shows the voltage at the first point 401, a fifth waveform 720 shows the voltage at the second point 402, a sixth waveform 730 shows the voltage at the third point 403, and a seventh waveform 740 shows the current through the first diode 610.

In FIG. 7, the fault 400 occurs at time T5, similar to the time T1 in FIG. 5. At the time T6 the wavefront of the travelling wave generated by the fault 400 arrives at the first converter station 310. After the time T6 the voltage at the second and third points 402, 403 begins to fall, similar to the scenario above described in relation to FIG. 5.

At the time T7, the voltage at the second point 402 is driven to a negative value as a result of the reflected wave. However, as a result of the reflected wave, the first diode 610 changes from being reverse biased and current blocking to being forward biased, and begins to conduct. The forward conduction of the first diode 610 prevents the voltage at the second point 402, between the time periods T6 and T8, from becoming negative, and instead the voltage remains at or around zero. In this manner, the first diode 610 prevents oscillations of the travelling wave, generated by the fault 400, at the first converter station 310.

To show a comparison of the voltage at the second and third points 402, 403 with and without the first and second diodes 610, 620, the second and third waveforms 520, 530 (from FIG. 5) are also shown in FIG. 7 in a dotted form. Thus, the fifth waveform 720 shows the voltage at the second point 402 during the fault 400 with the first and second diodes 610, 620 connected, whilst the second waveform 520 shows the voltage at the second point 402 during the fault 400 without the first and second diodes 610, 620 connected. Similarly, the sixth waveform 730 shows the voltage at the third point 403 during the fault 400 with the first and second diodes 610, 620 connected, whilst the third waveform 530 shows the voltage at the third point 403 during the fault 400 without the first and second diodes 610, 620 connected.

As such, the first diode 610 forward conducts when there would otherwise be a reflected wave causing a negative voltage at the first end 331*a* of the transmission line 331. The inventors have realised that the forward conduction of the first diode 610 can be used as a means to determine (meaning to detect and discriminate) a fault on a transmission line, and a circuit breaker can be triggered as a result of the determination. This advantageously allows for the determination to be made that a fault has occurred on a specific transmission line without requiring information to be transmitted from one side of the transmission line to the other. In other words, the determination that a fault has occurred on the specific transmission line can be made based on one side of the transmission line only. This improves the speed at which the determination can be made, and thus allows for the circuit breaker to be opened (triggered) much faster compared to the conventional methods discussed above. Accordingly, the advantages, as discussed above, of interrupting a lower fault current using a circuit breaker that has a relatively lower current and voltage rating, and is thus relatively less costly and smaller, can be realised.

Furthermore, in some circumstances, it may be desired to improve the reliability of the circuit breaker. This could be achieved by using a circuit breaker with a relatively higher voltage and current rating. Because the fault current will be relatively lower, the reliability of the circuit breaker to interrupt the lower fault current tends to be improved. In other words, the circuit breaker tends to be less likely to fail or experience a fault over long periods of time, due to an "over-rating" of the circuit breaker relative to the application.

Additionally, because only the diode connected to the faulty transmission line will conduct, the likelihood of triggering the wrong circuit breaker in a multi-terminal power transmission network is greatly reduced, or is zero. Thus, the determination of which circuit breaker to open is highly reliable, compared to other conventional methods.

Figure 8A:
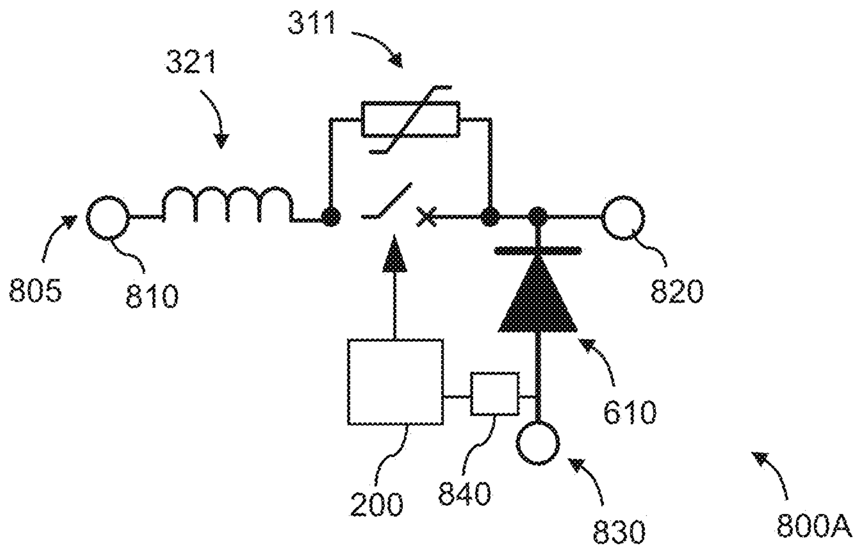
FIG. 8A is a schematic illustration of an example of a first system.
Figure 8B:
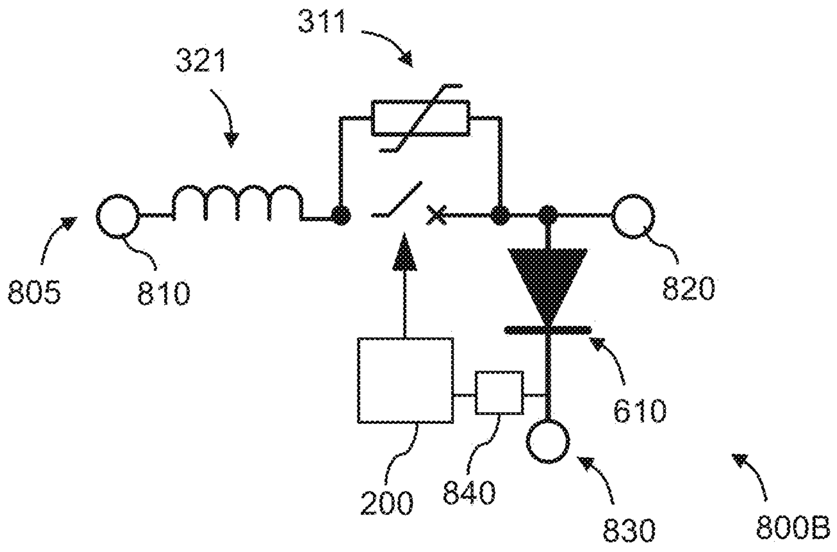
FIG. 8B is a schematic illustration of an example of a second system.
Figure 8C:
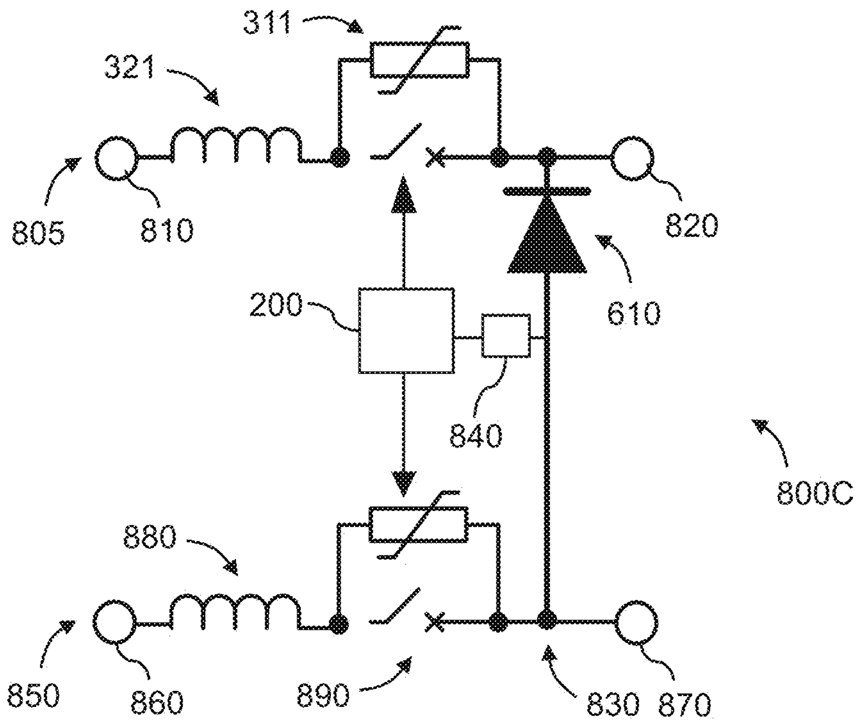
FIG. 8C is a schematic illustration of an example of a third system.

FIGS. 8A to 8C show examples of first, second and third sub-systems 800A, 800B, 800C that can be used to implement the invention in the multi-terminal power transmission network 300. Each of the sub-systems 800A, 800B, 800C comprises an electrical branch 805 having a first terminal 810 and a second terminal 820. An inductor 321 and a circuit breaker 311 are connected in series between the first terminal 810 and the second terminal 820. Each of the sub-systems 800A, 800B, 800C further comprise a diode arrangement 610 comprising at least one diode; a measurement device 840, and a controller 200. The controller 200 is the same controller 200 described above in relation to FIG. 2.

A first end of the diode arrangement 610 is connected to the electrical branch 805. The measurement device 840 is connected between the diode arrangement 610 and the controller 200. The controller 200 is configured to receive information or data from the measurement device 840 and use the information or data to control the circuit breaker 311. The circuit breaker 311 is configured to connect or disconnect the first terminal 810 and the second terminal 820, as discussed further below.

A second end of the diode arrangement 610 is connected to a third terminal 830. In each of the sub-systems 800A, 800B, 800C, the diode arrangement 610 or the third terminal 830 may be configured differently, as discussed further below.

In the first sub-system 800A, the third terminal 830 is connected to ground or to a neutral line of the multi-terminal power transmission network 300. The diode arrangement 610 is orientated such that the diode arrangement 610 is reverse biased and current blocking when there is a positive voltage on the electrical branch 805. This arrangement may be suitable for the positive pole of a monopole or bi-pole transmission scheme.

In the second sub-system 800B, the third terminal 830 is connected to ground or to a neutral line of the multi-terminal power transmission network 300. The diode arrangement 610 is orientated such that the diode arrangement 610 is reverse biased and current blocking when there is a negative voltage on the electrical branch 805. This arrangement may be suitable for the negative pole of a monopole or bi-pole transmission scheme.

The third sub-system 800C further comprises a second electrical branch 850 having a fourth terminal 860 and a fifth terminal 870. A second inductor 880 and a ninth circuit breaker 890 are connected in series between the fourth terminal 860 and the fifth terminal 870. The third terminal 830 is connected to the second electrical branch 850 between the ninth circuit breaker 890 and the fifth terminal 870.

In this embodiment, during a normal operation of the third sub-system 800C, the electrical branch 805 is configured to connect at positive pole of a power converter and thus have a positive voltage, and the second electrical branch 850 is configured to connect to a negative pole of the power converter and thus have a negative voltage. The diode arrangement 610 is orientated such that the diode arrangement 610 is reverse biased and current blocking when there is a positive voltage on the electrical branch 805. The controller 200 is further configured to be communicatively coupled to both of the circuit breakers 311, 890. As such, this arrangement may be suitable for both of the positive and negative poles of a symmetrical monopole transmission scheme.

In each of the sub-systems 800A, 800B, 800C, the controller 200 is configured to receive an indication signal that is indicative of a forward current in the diode arrangement 610.

In the first and second sub-systems 800A, 800B, the controller is configured to, in response to receiving the indication signal, issue a command to the circuit breaker 311 to disconnect the first terminal 810 and the second terminal 820.

In the third sub-system 800C the controller is configured to, in response to receiving the indication signal, issue a command to both of the circuit breakers 311, 890. The command is configured to cause the circuit breaker 311 to disconnect the first terminal 810 and the second terminal 820, and cause the ninth circuit breaker 890 to disconnect the fourth terminal 860 and the fifth terminal 870.

In this manner, each of the sub-systems 800A, 800B 800C are able to detect a fault on a transmission line, discriminate which specific line the fault is on from a plurality of lines in a multi-terminal transmission system, and isolate the fault, without having to transmit information from one side of the transmission line to the other. This is because only the circuit breaker connected to the faulty transmission line will be open, because only the diode arrangement connected to the faulty line will conduct the forward current. In other words, and adjacent diode on an adjacent line will not conduct a forward current unless there is a fault on the adjacent line.

The controller 200 can issue the command in less than 150 microseconds from receiving the indication signal. This makes determining that there has been a fault, and issuing a command to open the circuit breaker, considerably faster compared to conventional methods which may take, for example, several milliseconds.

The measurement device 840 is configured to measure the forward current through the diode arrangement 610, determine the indication signal based on the forward current; and output the indication signal.

The measurement device 840 may determine the indication signal as a signal based on or a time-derivative of the forward current through the diode arrangement; or as a (analogue) signal proportional to the forward current; or as a (digital) signal determined by comparing the forward current to a threshold value. The threshold value may be set on a tolerance or fault limit defined by an external controller, system, or user.

Figure 9:
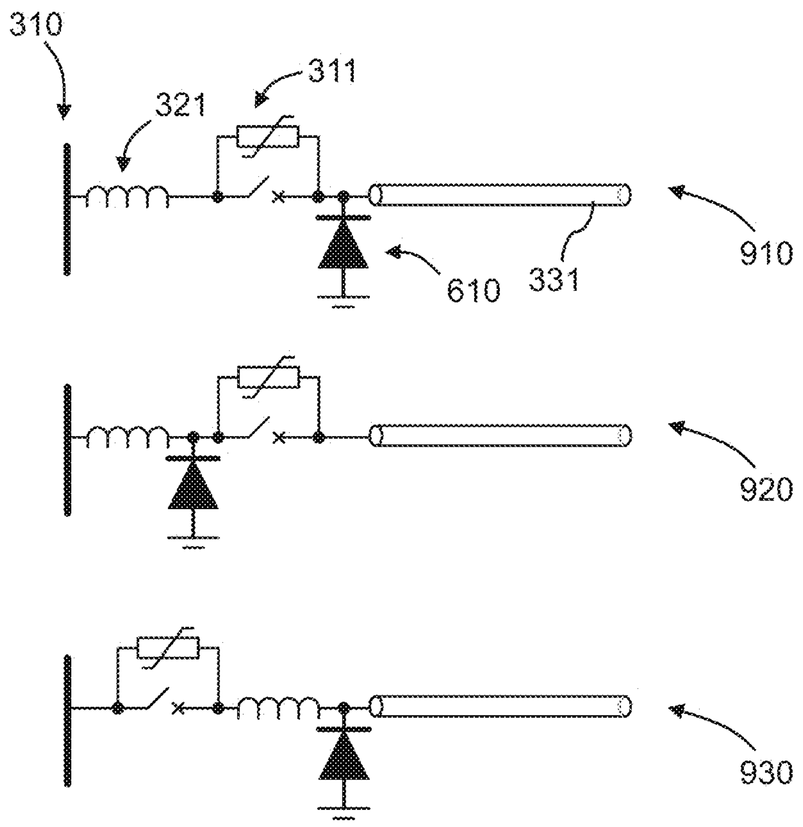
FIG. 9 is a schematic illustration of various examples of systems.

FIG. 9 shows first, second and third arrangements 910, 920, 930 of the inductor 321, the circuit breaker 311, and the first end of the diode arrangement 610 in the electrical branch 805, when the sub-system 800A is connected to a transmission line 311 (repeated reference numerals have been omitted for clarity). In each of the first, second and third arrangements 910, 920, 930 the first terminal 810 is connected to a converter station 310, and the second terminal 820 is connected to a transmission line 331. In the first arrangement 910, from the power station 310 to the transmission line 331, the inductor 321 is connected in series with the circuit breaker 311 connected in series with the first end of the diode arrangement 610. In the second arrangement 920, from the converter station 310 to the transmission line 331, the inductor 321 is connected in series with the first end of the diode arrangement 610 connected in series with the circuit breaker 311. In the third arrangement 930, from the power station 310 to the transmission line 331, the circuit breaker 311 is connected in series with the inductor 321 connected in series with the first end of the diode arrangement 610.

The diode arrangement 610 may comprise a plurality of diodes connected in series. The diode arrangement 610 may be configured to operate at a voltage of at least 100 kV.

The controller 200 may be further configured to, in response to receiving the indication signal, issue a second command to a second circuit breaker 312 outside of the sub-system 800A, 800B, 800C. In some embodiments the second command configures the second circuit breaker 312 from a regular state into an armed state, wherein in the armed state the second circuit breaker 312 is configured to open faster compared to a regular state. In other embodiments, the second command configures the second circuit breaker to open.

The sub-systems 800A, 800B, 800C can be implemented into a transmission network or a multi-terminal transmission network. For example, the sub-system 800 can be implemented on each end 331*a*, 331*b*, 332*a*, 332*b*, 333*a*, 333*b*, 334*a*, 334*b* of each transmission line 331, 332, 333, 334 of the multi-terminal power transmission network 300 described above in relation to FIG. 3.

Figure 10:
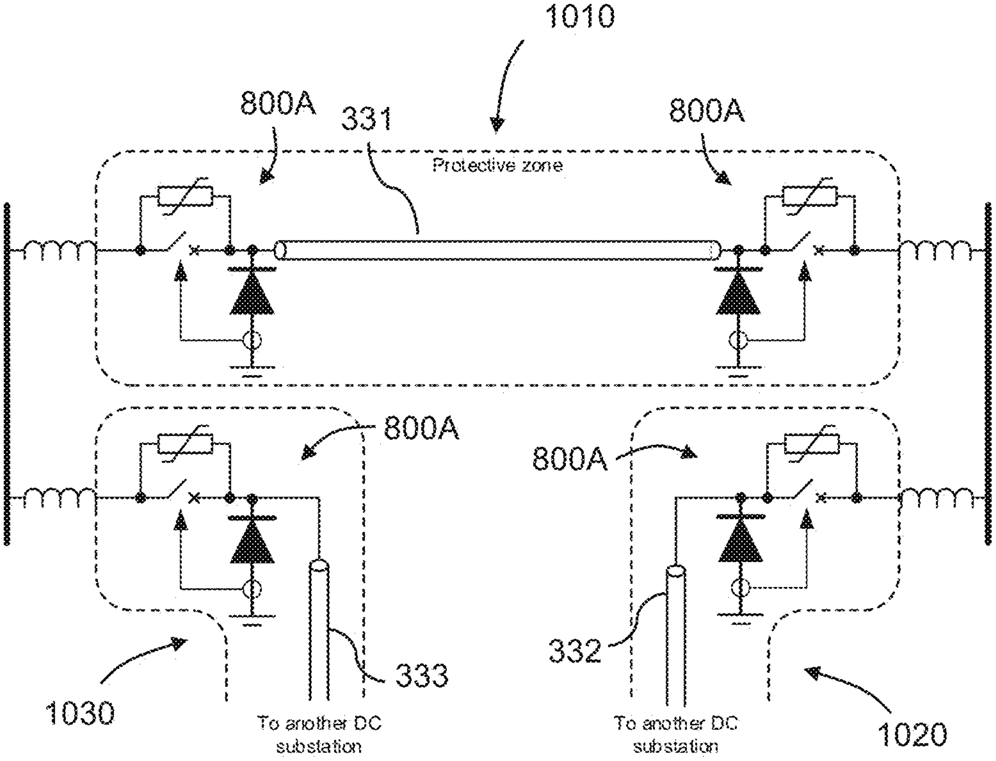
FIG. 10 is a schematic illustration of an example of a multi-terminal power transmission network separated into zones.

When using the sub-systems 800A, 800B, 800C in a multi-terminal power transmission network 300, each transmission line 331, 332, 333, 334 may be separated into a separate "zone" for control and fault management. For example, as shown in FIG. 10, a first zone 1010 may comprise the first transmission line 331 and a sub-system 800A on either side of the first transmission line 331. A second zone 1020 may comprise the second transmission line 332 and a sub-system 800A on either side of the second transmission line 332. A third protective zone 1030 may comprise the third transmission line 333 and a sub-system 800A on either side of the third transmission line 333.

In this manner, the sub-systems 800A, 800B, 800C, the controller 200, and methods disclosed herein can be used to improve the fault management on a transmission line.

I claim:

1. A system for managing a fault on a HVDC transmission line, the system comprising:

an electrical branch comprising an inductor and a circuit breaker connected in series between a first terminal and a second terminal, wherein the circuit breaker is configured to connect or disconnect the first terminal and the second terminal;

a diode arrangement comprising at least one diode, wherein a first end of the diode arrangement is directly connected to the electrical branch, and a second end of the diode arrangement is connected to a third terminal; and a controller configured to:

receive an indication signal, wherein the indication signal is indicative of a forward current in the diode arrangement; and in response to receiving the indication signal, issue a command to the circuit breaker to disconnect the first terminal and the second terminal.

2. The system of claim 1, wherein the third terminal is connected to ground, or to a neutral line, or to a negative line.

3. The system of claim 1, further comprising:

a second electrical branch comprising a second inductor and a second circuit breaker connected in series between a fourth terminal and a fifth terminal, wherein the second circuit breaker is configured to connect or disconnect the fourth terminal and the fifth terminal;

wherein the third terminal is connected to the second electrical branch; and wherein the controller is further configured to, in response to receiving the indication signal, issue the command to the second circuit breaker to disconnect the third terminal and the fourth terminal.

4. The system of claim 2, wherein the diode arrangement is orientated such that the diode arrangement is reverse biased and current blocking when there is a positive voltage on the electrical branch.

5. The system of claim 2, wherein the diode arrangement is orientated such that the diode arrangement is reverse biased and current blocking when there is a negative voltage on the electrical branch.

6. The system of claim 1, further comprising:

a measurement device connected to the diode arrangement and the controller;

wherein the measurement device is configured to:

measure the forward current through the diode arrangement;

determine the indication signal based on the forward current; and output the indication signal.

7. The system of claim 6, wherein the indication signal is:

a signal based on or a time-derivative of the forward current through the diode arrangement;

a signal proportional to the forward current; or a signal determined by comparing the forward current to a threshold value.

8. The system of claim 1, wherein the controller is configured to issue the command in less than 150 microseconds from receiving the indication signal.

9. The system of claim 1, wherein, in the electrical branch:

the inductor is connected in series between the first terminal and the circuit breaker, the circuit breaker is connected in series between the inductor and the first end of the diode arrangement, and the first end of the diode arrangement is connected in series between the circuit breaker and the second terminal; or the inductor is connected in series between the first terminal and the first end of the diode arrangement, the first end of the diode arrangement is connected in series between the inductor and the circuit breaker, and the circuit breaker is connected in series between the first end of the diode arrangement and the second terminal; or the circuit breaker is connected in series between the first terminal and the inductor, the inductor is connected in series between the circuit breaker and the first end of the diode arrangement, and the first end of the diode arrangement is connected in series between the inductor and the second terminal.

10. The system of claim 1, wherein the diode arrangement comprises a plurality of diodes connected in series; and the diode arrangement is configured to operate at a voltage of at least 100 kV.

11. The system of claim 1, wherein the controller is further configured to, in response to receiving the indication signal:

issue a second command to a further circuit breaker outside of the system;

wherein the second command configures the further circuit breaker from a regular state into an armed state, wherein in the armed state the further circuit breaker is configured to open faster compared to the regular state; or wherein the second command controls the further circuit breaker to open.

12. A HVDC system, comprising:

a converter station;

a High Voltage Direct Current, HVDC, transmission line; and the system of claim 1;

wherein a first end of the HVDC transmission line is connected to the second terminal; and wherein the converter station is connected to the first terminal.

13. The HVDC system of claim 12, wherein the HVDC transmission line has a length of at least 100 km; and the HVDC transmission line is configured to operate at a voltage of at least 300 kV.

14. A multi-terminal High Voltage Direct Current, HVDC, transmission network, comprising:

a first converter station;

a second converter station;

a third converter station;

a first HVDC transmission line; and a second HVDC transmission line; wherein the first converter station is connected to a first end of the first HVDC transmission line by a first sub-system;

the second converter station is connected to a second end of the first HVDC transmission line by a second sub-system;

the first converter station is connected to a first end of the second HVDC transmission line by a third sub-system;

the third converter station is connected to a second end of the second HVDC transmission line by a fourth sub-system; and the first, second, third and fourth sub-systems each comprise the system of claim 1.

15. A method for managing a fault on a HVDC transmission line by using a system, the system comprising an electrical branch and a diode arrangement, wherein the electrical branch comprises an inductor and a circuit breaker connected in series between a first terminal and a second terminal, wherein the circuit breaker is configured to connect or disconnect the first terminal and the second terminal, and wherein the diode arrangement comprises at least one diode, wherein a first end of the diode arrangement is directly connected to the electrical branch, and a second end of the diode arrangement is connected to a third terminal; the method comprising:

receiving, by a controller, an indication signal, wherein the indication signal is indicative of a forward current in the diode arrangement; and in response to receiving the indication signal, issuing, by the controller, a command to the circuit breaker to disconnect the first terminal and the second terminal.

* * * * *